United States Patent
Hashimoto et al.

(10) Patent No.: US 9,754,833 B2
(45) Date of Patent: Sep. 5, 2017

(54) METHOD FOR MANUFACTURING SEMICONDUCTOR CHIP THAT INCLUDES DIVIDING SUBSTRATE BY ETCHING GROOVE ALONG CUTTING REGION OF SUBSTRATE COMBINED WITH FORMING MODIFIED REGION BY LASER IRRADIATING ALONG CUTTING REGION IN SUBSTRATE

(71) Applicant: FUJI XEROX CO., LTD., Tokyo (JP)

(72) Inventors: Takahiro Hashimoto, Kanagawa (JP);
Kenichi Ono, Kanagawa (JP);
Michiaki Murata, Kanagawa (JP);
Hideyuki Ikoma, Kanagawa (JP);
Tsutomu Otsuka, Kanagawa (JP)

(73) Assignee: FUJI XEROX CO., LTD., Tokyo (JP)

(*) Notice: Subject to any disclaimer, the term of this patent is extended or adjusted under 35 U.S.C. 154(b) by 0 days.

(21) Appl. No.: 14/817,924

(22) Filed: Aug. 4, 2015

(65) Prior Publication Data

US 2016/0071767 A1 Mar. 10, 2016

(30) Foreign Application Priority Data

Sep. 8, 2014 (JP) .................................. 2014-182137

(51) Int. Cl.
| | |
|---|---|
| *H01L 21/306* | (2006.01) |
| *H01L 21/78* | (2006.01) |
| *H01L 33/00* | (2010.01) |
| *H01L 21/02* | (2006.01) |
| *H01L 21/683* | (2006.01) |

(52) U.S. Cl.
CPC ........ *H01L 21/78* (2013.01); *H01L 21/02019* (2013.01); *H01L 21/30604* (2013.01); *H01L 21/30621* (2013.01); *H01L 21/6836* (2013.01); *H01L 33/0095* (2013.01); *H01L 2221/68327* (2013.01); *H01L 2221/68381* (2013.01)

(58) Field of Classification Search
CPC ............. H01L 21/02019; H01L 21/268; H01L 21/30604; H01L 21/3065; H01L 21/30655; H01L 21/428; H01L 21/477; H01S 5/0203
USPC ................................ 438/460, 462, 463, 464
See application file for complete search history.

(56) References Cited

U.S. PATENT DOCUMENTS

| | | | |
|---|---|---|---|
| 7,897,485 B2 | 3/2011 | Parekh | |
| 8,108,998 B2* | 2/2012 | Inada ................. | B23K 26/0057 216/27 |
| 2010/0015782 A1* | 1/2010 | Yu ........................... | H01L 21/78 438/463 |
| 2010/0140630 A1* | 6/2010 | Hamaguchi ............ | B23K 26/40 257/79 |

(Continued)

FOREIGN PATENT DOCUMENTS

| | | |
|---|---|---|
| JP | 61-267343 A | 11/1986 |
| JP | 4-10554 A | 1/1992 |
| JP | 2009-140950 A | 6/2009 |

*Primary Examiner* — Stephen W Smoot
(74) *Attorney, Agent, or Firm* — Sughrue Mion, PLLC

(57) ABSTRACT

A method for manufacturing a semiconductor chip includes forming at least a portion of a front-side groove by anisotropic dry etching from a front surface of a substrate along a cutting region; forming a modified region in the substrate along the cutting region by irradiating the inside of the substrate with a laser along the cutting region; and dividing the substrate along the cutting region by applying stress to the substrate.

12 Claims, 14 Drawing Sheets

(56) References Cited

U.S. PATENT DOCUMENTS

2012/0211748 A1* 8/2012 Miccoli .............. B23K 26/0057
  257/52
2013/0337633 A1* 12/2013 Seddon ................... H01L 21/78
  438/462

* cited by examiner

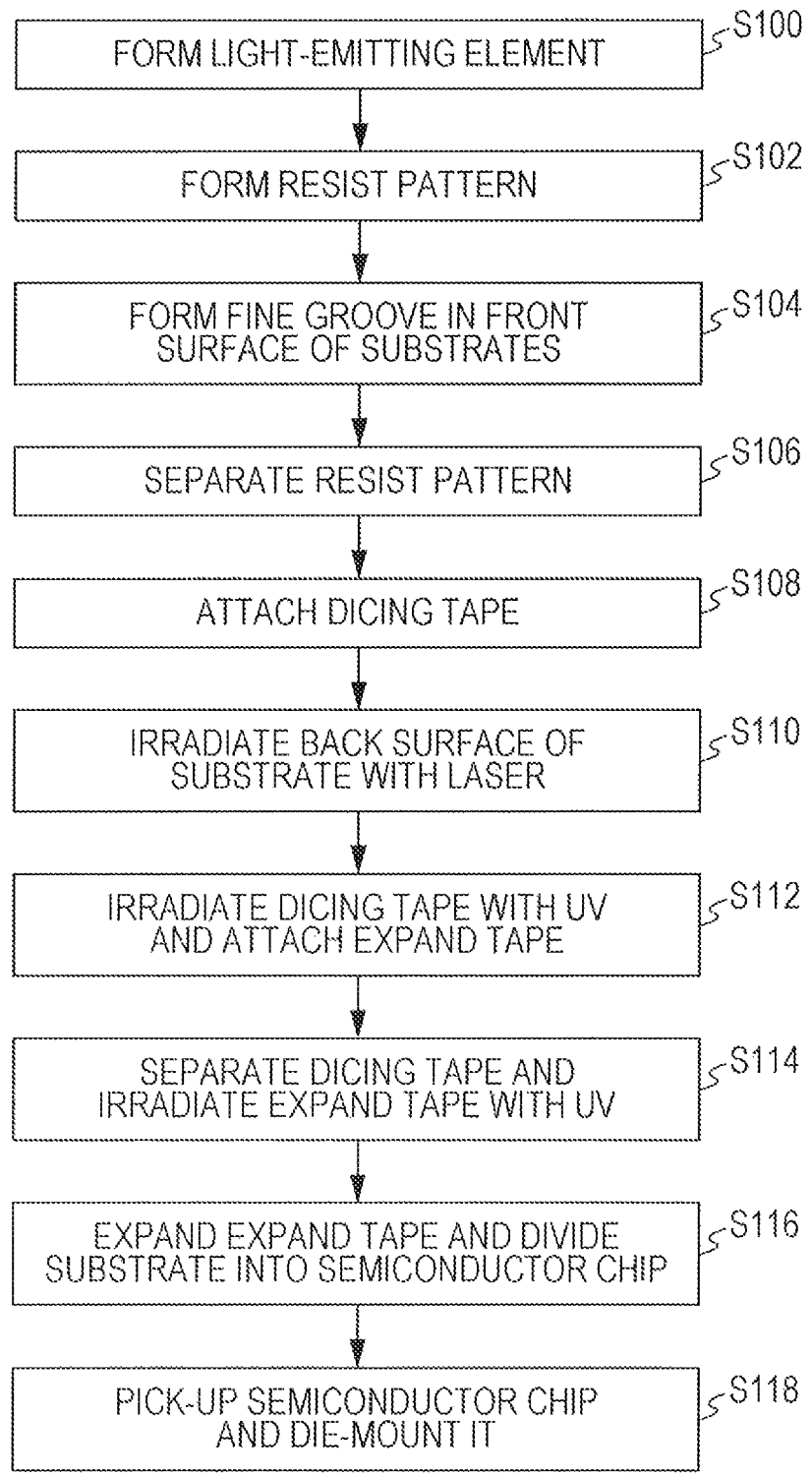

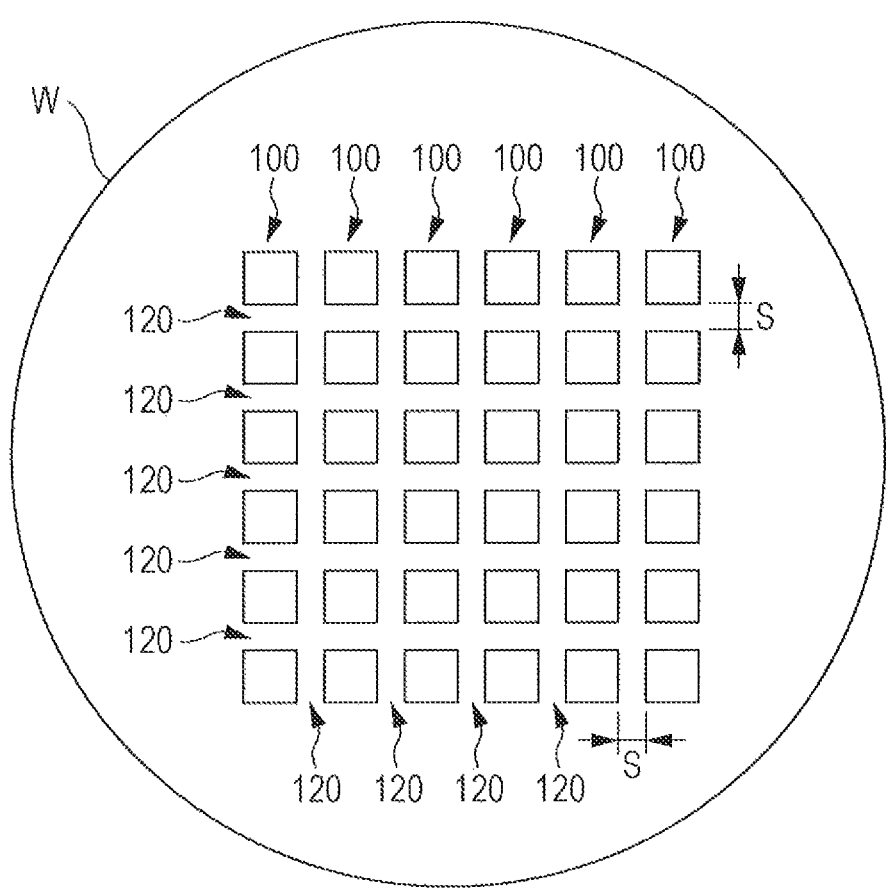

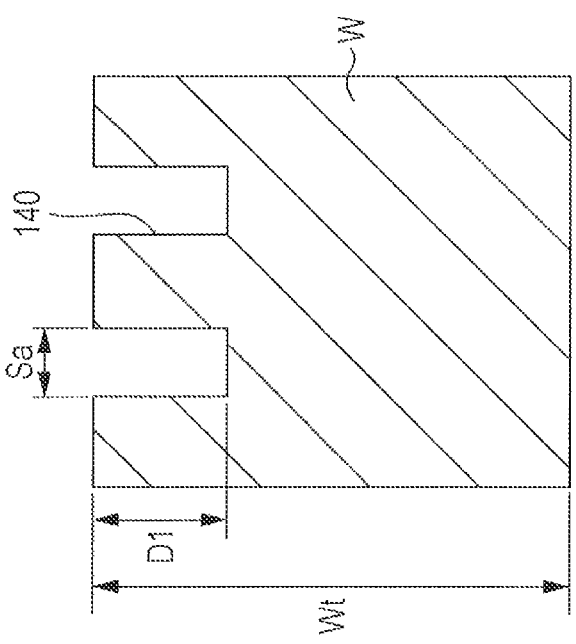
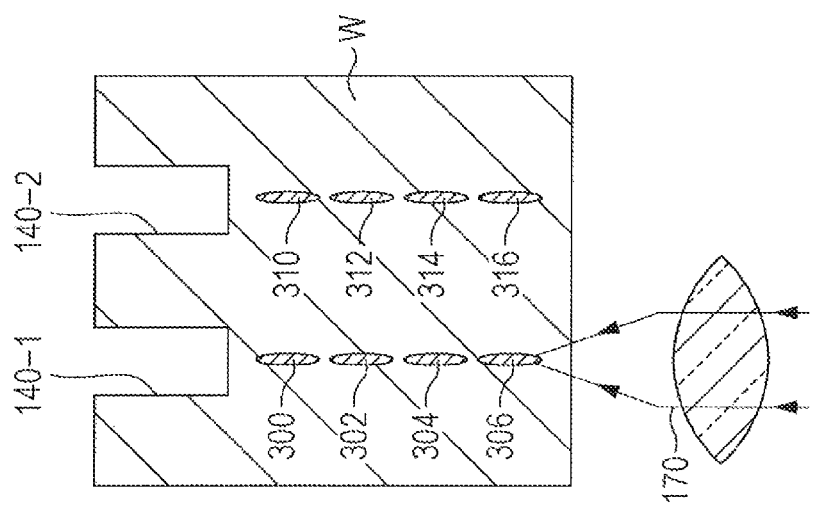
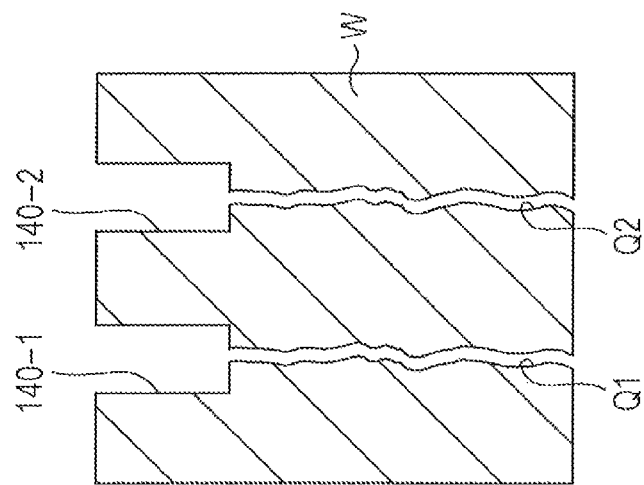

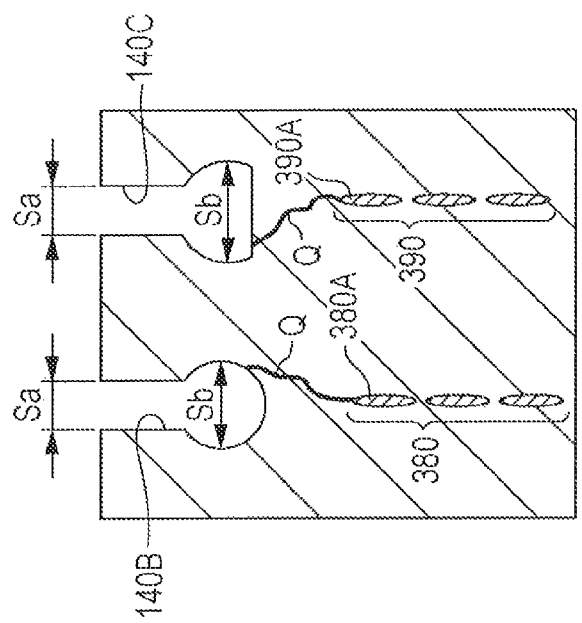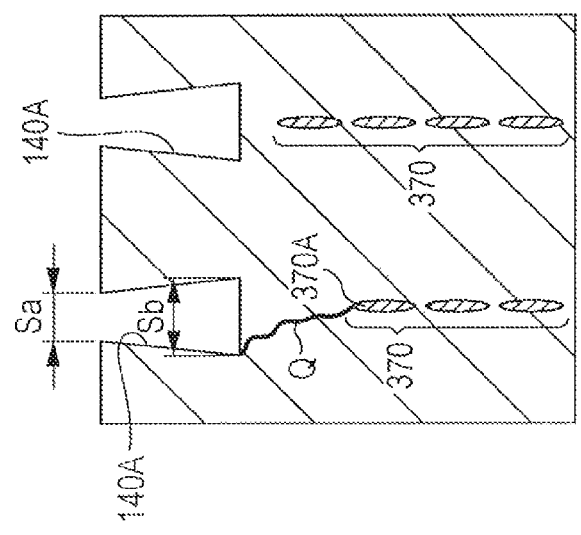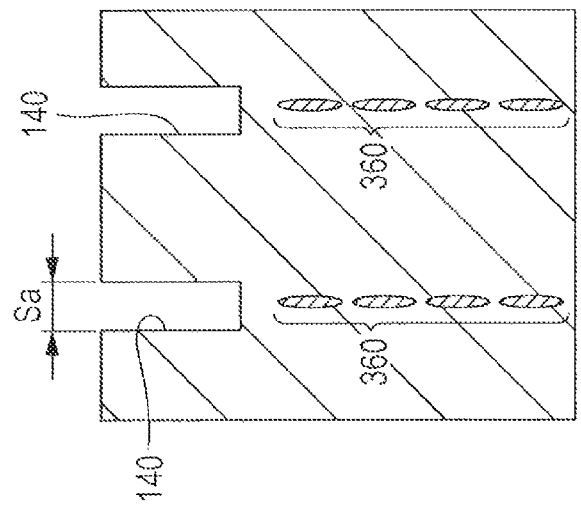

● : RADICAL
○ : ION

● : RADICAL
○ : ION

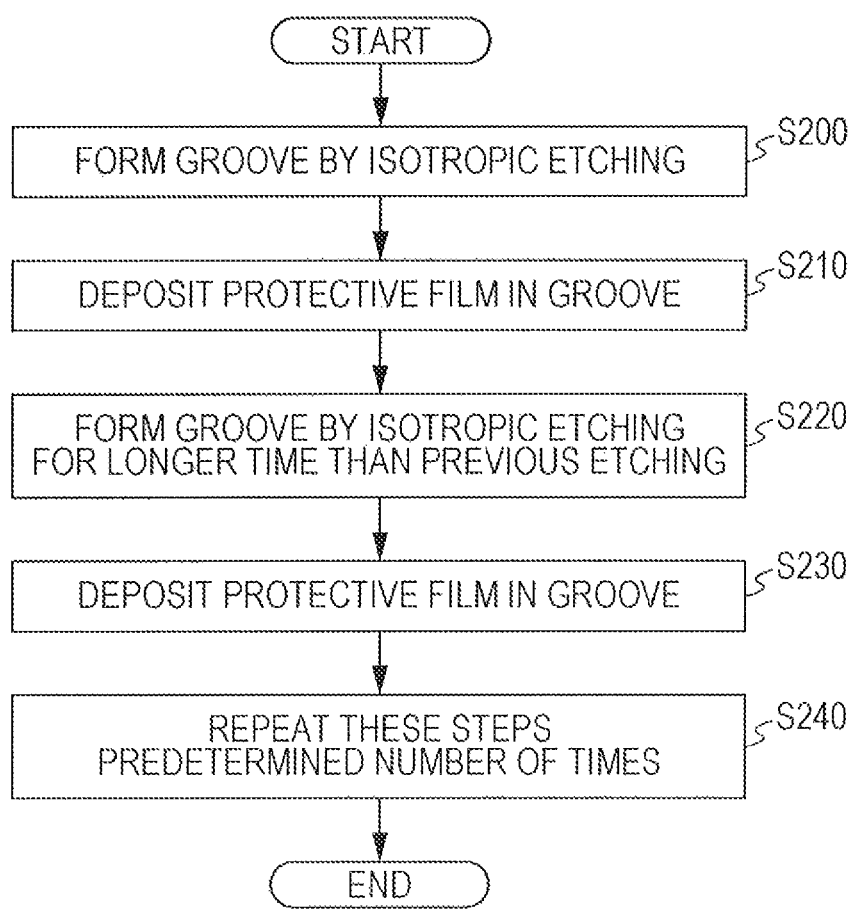

● : RADICAL
○ : ION

METHOD FOR MANUFACTURING SEMICONDUCTOR CHIP THAT INCLUDES DIVIDING SUBSTRATE BY ETCHING GROOVE ALONG CUTTING REGION OF SUBSTRATE COMBINED WITH FORMING MODIFIED REGION BY LASER IRRADIATING ALONG CUTTING REGION IN SUBSTRATE

CROSS-REFERENCE TO RELATED APPLICATIONS

This application is based on and claims priority under 35 USC 119 from Japanese Patent Application No. 2014-182137 filed Sep. 8, 2014.

BACKGROUND (i) Technical Field

The present invention relates to a method for manufacturing a semiconductor chip and a circuit board and an electronic apparatus each including a semiconductor chip.

(ii) Related Art

A known method for manufacturing semiconductor chips includes forming modified regions inside a substrate by irradiating the inside of the substrate with a laser along cutting regions, and then dividing the substrate along the cutting regions by applying stress. In the manufacturing method, in the step of dividing the substrate by applying stress, the substrate is divided depending on only the modified regions in the substrate, thereby causing variation in a position where a crack reaches a surface of the substrate in association with division. Therefore, it is necessary to secure a cutting width of, for example, about 20 μm, and it is difficult to further decrease the cutting width.

SUMMARY

According to an aspect of the invention, there is provided a method for manufacturing a semiconductor chip, the method including forming at least a portion of a front-side groove by anisotropic dry etching from a front surface of a substrate along a cutting region; forming a modified region in the substrate along the cutting region by irradiating the inside of the substrate with a laser along the cutting region; and dividing the substrate along the cutting region by applying stress to the substrate.

According to an aspect of the present invention, a cutting width may be decreased as compared with when the substrate is divided depending on modified regions in the substrate without forming front-side grooves.

Also, deviation of a crack extension position from the front-side groove in association with division of the substrate may be suppressed as compared with when the width of the front-side groove is narrower than the width of the modified region.

Further, deviation of a crack extension position from the front-side groove in association with division of the substrate may be suppressed as compared with a shape in which the front-side groove has a uniform width.

Further, the number of modified marks formed in the thickness direction of the substrate may be decreased.

Further, deviation of a crack extension position from the front-side groove in association with division of the substrate may be suppressed as compared with when the distance between the bottom of the front-side groove and the modified mark nearest to the bottom is the same as the distance between the modified marks.

Further, a crack may be matched with the bottom of the front-side groove as compared with when the modified mark nearest to the surface of the substrate is separated from the bottom of the front-side groove.

Further, it is possible to form a groove shape in which deviation of a crack extension position from the front-side groove in association with division of the substrate may be suppressed as compared with when an etching condition is not changed.

Further, it is easy to form a groove shape in which deviation of a crack extension position from the front-side groove in association with division of the substrate may be suppressed as compared with when the front-side groove is formed only by anisotropic dry etching.

Further, deviation of a crack extension position from the front-side groove in association with division of the substrate may be suppressed as compared with when the front-side groove is formed only by first anisotropic dry etching.

BRIEF DESCRIPTION OF THE DRAWINGS

Exemplary embodiments of the present invention will be described in detail based on the following figures, wherein:

FIG. 1 is a flow chart showing an example of a process for manufacturing a semiconductor chip according to an exemplary embodiment of the present invention;

FIG. 4 is a schematic plan view of a semiconductor substrate (wafer) at the completion of formation of circuits;

FIGS. 5A to 5C are schematic cross-sectional views illustrating steps for dicing according an exemplary embodiment of the present invention;

FIGS. 7A to 7C are cross-sectional views showing examples of configurations of fine grooves which can be applied to dicing according to an exemplary embodiment of the present invention;

FIG. 12 is a flow chart showing a second method for producing fine grooves according to an exemplary embodiment of the present invention;

DETAILED DESCRIPTION

Figure 2A:
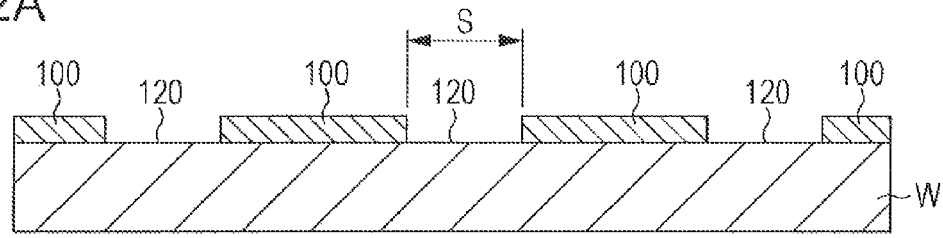
FIGS. 2A to 2E are schematic cross-sectional views of a semiconductor substrate in a process for manufacturing a semiconductor chip according to an exemplary embodiment of the present invention.

A method for manufacturing a semiconductor chip according to an exemplary embodiment of the invention is applied to, for example, a method for manufacturing individual semiconductor chips by dividing, into individual chips, a substrate-shaped member such as a semiconductor wafer on which plural semiconductor elements have been formed. The substrate to be divided may be a substrate of silicon, SiC, a compound semiconductor, sapphire, or the like, and the material and size of the substrate are not considered as long as modified regions (described in detail below) can be formed in the substrate by a laser and the substrate can be divided by using the modified regions. The semiconductor elements formed on the substrate are not particularly limited and include a light-emitting element, an active element, a passive element, and the like. As an example, the manufacturing method according to an exemplary embodiment of the invention is applied to a method for taking out a semiconductor chip including a light-emitting element from a substrate, and the light-emitting element may be a surface-emitting semiconductor laser, a light-emitting diode, or a light-emitting thyristor. A semiconductor chip may include a single light-emitting element or plural light-emitting elements arranged in an array, and a semiconductor chip may further include a drive circuit which drives one or plural light-emitting elements. According to an exemplary embodiment of the present invention, the substrate is a group III-V compound semiconductor substrate of GaAs or the like on which a light-emitting element such as a surface-emitting semiconductor laser, a light-emitting diode, or the like is formed.

In description below, a method for taking out individual semiconductor chips from the semiconductor substrate on which plural light-emitting elements have been formed is described with reference to the drawings. In addition, it is noted that the scale and shape of each of the drawings are emphasized for facilitating understanding of the characteristics of the invention and are not necessarily the same as the scale and shape of an actual device.

Exemplary Embodiment

FIG. 1 is a flow chart showing an example of a process for manufacturing semiconductor chips according to an exemplary embodiment of the invention. As shown in FIG. 1, the method for manufacturing semiconductor chips according to the exemplary embodiment includes a step (S100) of forming light-emitting elements, a step (S102) of forming a resist pattern on a front surface of a semiconductor substrate, a step (S104) of forming fine grooves in the front surface of the semiconductor substrate, a step (S106) of separating the resist pattern, a step (S108) of attaching a dicing tape to the front surface of the semiconductor substrate, a step (S110) of irradiating the back surface of the substrate with a laser for dicing, a step (S112) of irradiating the dicing tape with ultraviolet light (UV) and attaching an expand tape to the back surface of the semiconductor substrate, a step (S114) of separating the dicing tape and irradiating the expand tape with ultraviolet light, a step (S116) of expanding the expand tape and dividing the semiconductor substrate into semiconductor chips by applying stress to the substrate, and a step (S118) of picking a semiconductor chip by a collet and die-mounting the semiconductor chip on a circuit board or the like. The cross-sectional views of a semiconductor substrate shown in FIGS. 2A to 2E and FIGS. 3A to 3E correspond to the respective steps from S100 to S118.

In the step (S100) of forming light-emitting elements, as shown in FIG. 2A, plural light-emitting elements 100 are formed on the front surface of a semiconductor substrate W of GaAs or the like. Each of the light-emitting elements 100 is, for example, a surface-emitting semiconductor laser, a light-emitting diode, a light-emitting thyristor, or the like. In the drawing, a region is shown as each of the light-emitting elements 100, but each of the light-emitting elements 100 is shown as an example of elements included in a divided semiconductor chip. It is noted that the region of each of the light-emitting elements 100 may include not only one light-emitting element but also plural light-emitting elements and another circuit element. In addition, the light-emitting elements are emphasized by being shown to project from the surface of the substrate in order to make the description easy to understand. However, the light-emitting elements 100 may be formed so as to be substantially flush with the surface of the substrate.

FIG. 4 is a plan view showing an example of the semiconductor substrate W at the completion of the step of forming light-emitting elements. For the sake of convenience, the drawing shows only the light-emitting elements 100 in a central portion. Plural light-emitting elements 100 are formed in row and column directions of an array on the surface of the semiconductor substrate W. Each of the light-emitting elements 100 has a substantially rectangular planar region, and the light-emitting elements 100 are separated from each other in a lattice shape by cutting regions 120 defined by scribe lines having a predetermined space S.

Figure 2B:
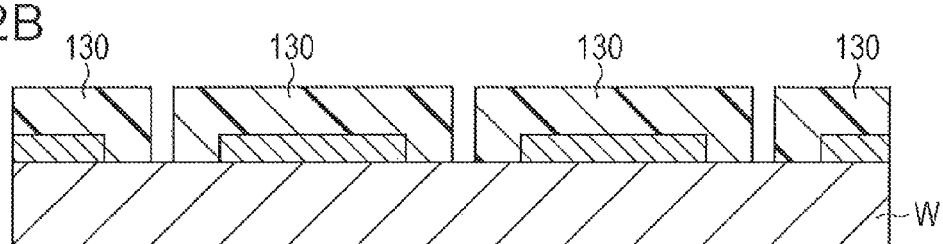

When the formation of the light-emitting elements is completed, next, a resist pattern is formed on the front surface of the semiconductor substrate W (S102). As shown in FIG. 2B, the resist pattern 130 is processed so as to expose the cutting regions 120 defined by the scribe lines on the surface of the semiconductor substrate W. The resist pattern 130 is processed by a photolithographic process.

Figure 2C:
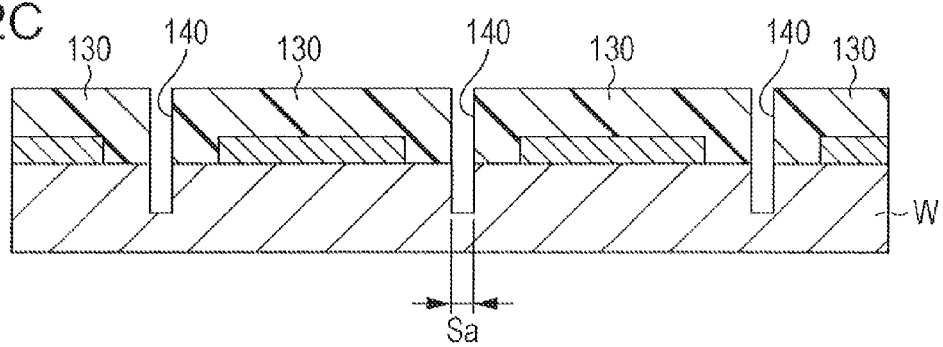

Next, fine grooves are formed in the surface of the semiconductor substrate W (S104). As shown in FIG. 2C, fine grooves (hereinafter referred to as "fine grooves" or "front-side grooves" for convenience sake) 140 with a predetermined depth are formed in the surface of the semiconductor substrate W by using the resist pattern 130 as a mask. FIG. 2C shows as an example the straight fine grooves 140 each having side surfaces substantially vertically extending from the surface of the substrate, a sufficiently large depth relative to an aperture width Sa, and a high aspect ratio. The width of the fine groove 140 is smaller than the space S of the cutting regions 120, and if the width Sa can be processed to be small, the space S of the cutting regions 120 can be decreased, thereby decreasing a cutting allowance of the semiconductor substrate. The fine grooves 140 can be formed by, for example, anisotropic dry etching, and narrower fine grooves can be formed by anisotropic plasma etching (reaction ion etching) which is anisotropic dry etching. The grooves may be formed by using a thin dicing blade, isotropic etching, or the like, but narrow and deep grooves can be formed by anisotropic dry etching as compared with front-side grooves formed by isotropic etching. Also, the influences of vibration, stress, and the like on the light-emitting elements 100 around the fine grooves are more suppressed than in the use of a dicing blade. The width Sa of the fine grooves 140 is substantially the same as the width of apertures formed in the resist pattern 130, and is, for example, several μm to ten-odd μm. The depth of the fine grooves 140 is, for example, about 10 μm to 100 μm, and is deeper than the depth to which at least functional elements such as light-emitting elements are formed. When the fine grooves 140 are formed by a general dicing blade, the space S of the cutting regions 120 is increased to about 40 μm to 60 μm which is a total of the groove width formed by the dicing blade and a margin width in consideration of an amount of chipping. On the other hand, when the fine grooves 140 are formed by a semiconductor process, not only the grooves are narrower, but also the margin width for cutting is narrower than the margin width the use of the dicing blade. That is, the space S of the cutting regions 120 is decreased, and thus the number of semiconductor chips taken out is increased by arranging, at a high density, light-emitting elements on a wafer. In the exemplary embodiment, the front side represents the surface side on which functional elements such as light-emitting elements are formed, and the back side represents the surface side opposite to the front side.

Figure 2D:
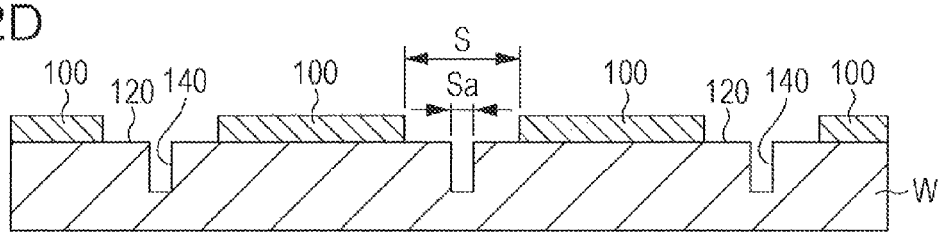

Next, the resist pattern 130 is separated (S106). As shown in FIG. 2D, when the resist pattern 130 is separated from the surface of the semiconductor substrate, the fine grooves 140 formed along the cutting regions 120 are exposed in the surface.

Figure 2E:
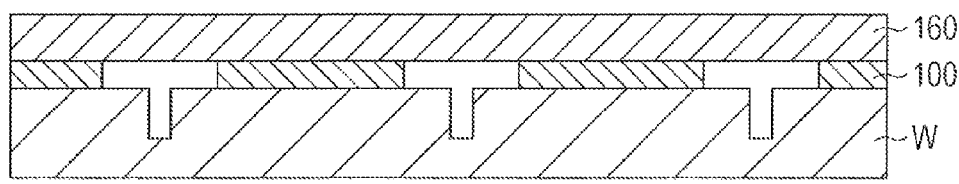

Next, an ultraviolet curable dicing tape is attached to the front surface the substrate (S108). As shown in FIG. 2E, a dicing tape 160 having an adhesive layer on the light-emitting element side is attached to protect the front surface of the substrate.

Figure 3A:
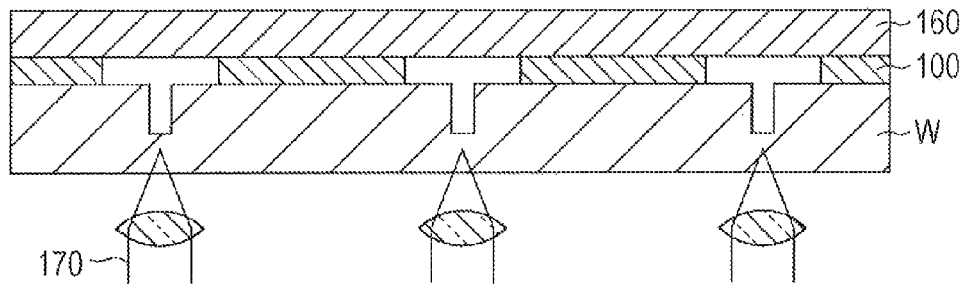
FIGS. 3A to 3E are schematic cross-sectional views of a semiconductor substrate in a process for manufacturing a semiconductor chip according to an exemplary embodiment of the present invention.

Next, laser irradiation for dicing is performed from the back surface of the substrate (S110). In laser irradiation, as shown in FIG. 3A, a laser beam 170 at a wavelength having transmittance through the substrate is converged in the substrate by using an objective lens or the like. The converged laser beam 170 has a very small spot diameter, and energy is concentrated in the spot. As a result, only a region where the laser beam 170 is converged is locally and selectively changed to have properties different from other regions of the substrate. The region where the properties are changed by laser irradiation is referred to as a "modified region". The modified region is formed at a position corresponding to each of the fine grooves 140 and at a desired depth in the substrate. The modified region serves as a starting point of crack in a subsequent expansion step, and the crack extends from the back surface of the substrate to each of the fine grooves 140 to divide the substrate into individual semiconductor chips. The dicing is described in detail below.

Figure 3B:
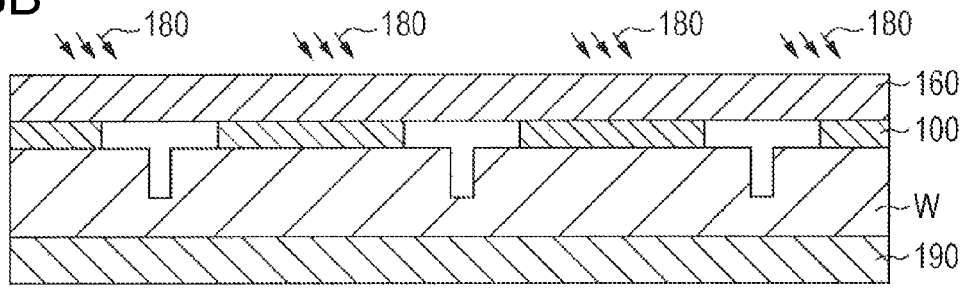

Next, the dicing tap 160 attached to the front surface of the substrate is irradiated with ultraviolet light (UV), and an expand tape is attached to the back surface of the substrate (S112). As shown in FIG. 3B, the dicing tape 160 is irradiated with ultraviolet light 180 to cure the adhesive layer of the dicing tape 160. On the other hand, the expand tape 190 is attached to the back surface of the semiconductor substrate. The expand tape 190 is made of a base material having stretchability, and the tape 190 is expanded to allow semiconductor chips to be cut out and make the divided semiconductor chips easy to pick up. The irradiation of ultraviolet light 180 and the attachment of the expand tape 190 may be performed in any desired order.

Figure 3C:
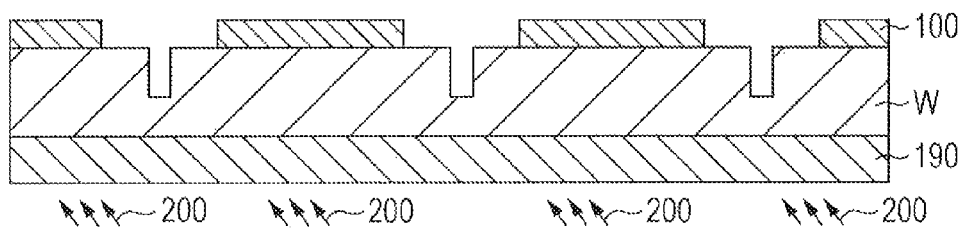

Next, the dicing tape is separated, and the expand tape is irradiated with ultraviolet light (S114). As shown in FIG. 3C, the dicing tape 160 is separated from the surface of the semiconductor substrate.

Figure 3D:
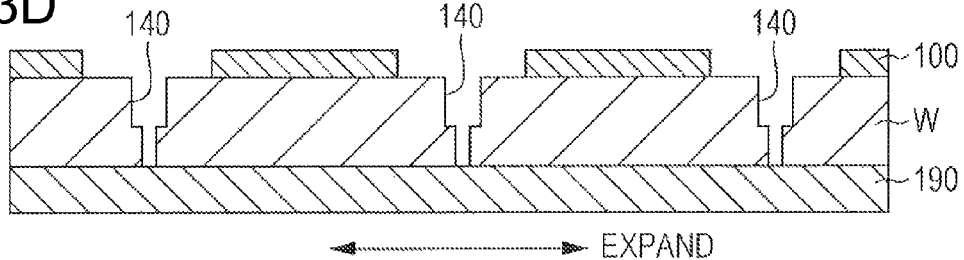

Next, the expand tape 190 is expanded and the substrate is divided into semiconductor chips (S116). The expand tape 190 is irradiated with ultraviolet light 200 to cure an adhesive layer of the expand tape 190, and then as shown in FIG. 3D, the expand tape 190 is expanded in a one-dimensional or two-dimensional direction. By the expansion, stress in a tensile direction is mainly applied to the substrate, and cracks starting from the modified regions formed in the substrate occur, thereby cutting out individual semiconductor chips.

Figure 3E:
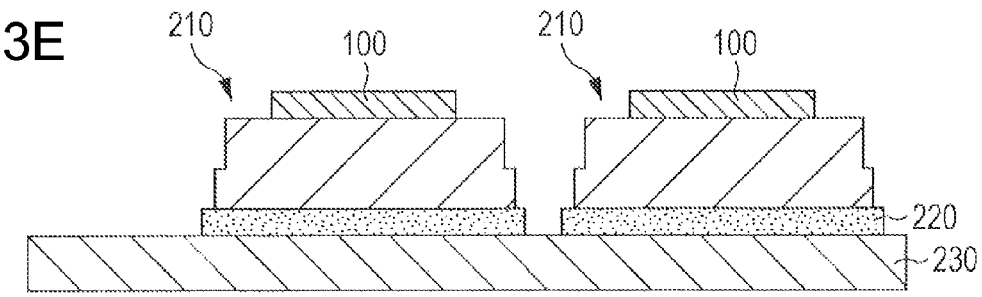

Next, the divided semiconductor chips are picked up and die-mounted (S118). As shown in FIG. 3E, semiconductor chips 210 picked up from the expand tape 190 by a collet are bonded on a circuit board 230 through an adhesive 220 using conductive paste of solder or the like.

Next, details of dicing according to the exemplary embodiment are described. Dicing according to the exemplary embodiment uses a method in which a laser beam at a wavelength having transmittance through the substrate is converged to be focused in the substrate by an optical system such as an objective lens or the like to selectively form modified regions in the substrate, and cracks starting from the modified regions are generated by applying stress to the substrate, thereby cutting the substrate from the inside thereof. On the other hand, usual dicing uses a method in which heat-melting or abrasion of a substrate is caused by irradiating a front surface of the substrate with a laser beam at a wavelength having absorption by the substrate, thereby cutting the substrate from the front surface. The usual laser dicing has the problem of degrading the reliability of light-emitting elements on the front surface of the substrate due to the influence of heat or the influence of dust produced by abrasion. However, the dicing according to the exemplary embodiment has the advantage of decreasing the influence of heat or dust as compared with the usual laser dicing.

The modified regions formed by laser irradiation are generally defined as follows. The modified regions are regions in a state in which density, refractive index, mechanical strength, and other physical properties are different from those in surroundings. Examples of the modified regions include a melting-treated region, a crack region, a dielectric breakdown region, a refractive index changed region, and a region where these regions are mixed. Further examples of the modified regions include a region where the density in a modified region of a workpiece material is changed as compared with the density in a non-modified region, and a region where a lattice defect is formed (these are also collectively referred to as "high-density transition regions"). Also, a melting-treated region, a refractive index changed region, a region where the density in a modified region is changed as compared with the density in a non-modified region, and a region where a lattice defect is formed may further include a crack (microcrack) inside the region or at an interface between the modified region and the non-modified region. The included crack may extend over the entire region of the modified region or formed only in a portion or plural portions.

In addition, when a pulsed laser is used for dicing according to the exemplary embodiment, a laser shot of one pulse driven at a predetermined frequency forms one modified spot (processing mark), and plural modified spots (processing marks) are collected as if to be continued to form a modified region. For example, a laser beam is scanned according to the cutting regions of the semiconductor substrate, collections of plural modified spots formed along the cutting regions form the modified regions along the cutting regions. The size of the modified spots and the length of cracks generated are appropriately controlled in view of the required cutting precision, the required flatness of a cut surface, the thickness, type, crystal orientation of a work piece, and the like.

FIGS. 5A to 5C are schematic cross-sectional views illustrating specified steps for dicing according to the exemplary embodiment. As shown in FIG. 5A, the substrate W has a thickness Wt and fine grooves 140 formed in the front surface thereof by a dry process and having a width Sa, a depth D1, and a large aspect ratio.

Next, as shown in FIG. 5B, the back surface of the substrate is irradiated with a laser. This corresponds to step S110 in FIG. 1. A laser beam 170 is scanned from the back surface of the substrate so as to coincide with the positions of the fine grooves 140 while the positions of the fine grooves 140 in the front surface are confirmed. For example, the substrate is placed on a stage which can be moved in the three-dimensional directions of X, Y, and Z, and the laser is scanned by relatively moving the stage or relatively moving a laser light source while the substrate is fixed. Alternatively, the laser is scanned by fixing the substrate and the laser light source and operating an optical system such as a polygon or the like between the substrate and the laser light source.

At least one modified region is formed in the substrate in the thickness direction of the substrate according the cutting distance. In the substrate having the fine grooves 140 formed according to the exemplary embodiment, the cutting distance corresponds to a difference (Wt−D1) between the thickness Wt of the substrate and the depth D1 of the fine grooves, and one or plural modified regions are formed in the thickness direction of the substrate according to the distance. In an example shown in FIG. 5B, four modified regions 300, 302, 304, and 306 are formed below a fine groove 140-1, and four modified regions 310, 312, 314, and 316 are formed below a fine groove 140-2. In order to form the modified regions at different positions in the thickness direction of the substrate, the focal point of the laser beam 170 is adjusted in the thickness direction. As described above, each of the modified regions includes a collection of plural modified spots scanned in the direction to the back surface of the sheet of the drawing. In other words, each of the modified regions shown in a cross section of FIG. 5B represents one modified spot.

Also, in the example shown in FIG. 5B, the modified regions (or the modified spots) are emphasized by being shown to be vertically elongated. This shows that a high energy density is produced before and behind a focal position according to the depth of focus, thereby forming vertically elongated modified regions. On the other hand, the width of the modified regions in a direction parallel to the surface of the substrate substantially equals to the spot diameter of a laser beam converged by the objective lens or the like.

Next, the substrate W is divided into individual semiconductor chips in the expansion step (corresponding to step S116 in FIG. 1). The back surface of the substrate is supported by the adhesive layer of the expand tape, and when the expand tape is expanded in the two-dimensional direction, stress is applied to the substrate in a direction in which the substrate is expanded. Therefore, as shown in FIG. 5C, crack Q1 occurs starting from the four modified regions 300 to 306 in a substantially vertical direction, and the crack Q1 finally extends to the bottom of the fine groove 140-1 from the back surface of the substrate. Similarly, crack Q2 occurs starting from the four modified regions 310 to 316 in a substantially vertical direction, and the crack Q2 finally extends to the bottom of the fine groove 140-2 from the back surface of the substrate. As a result, the substrate is divided into semiconductor chips by cutting through the fine grooves 140. In the case of smaller divided semiconductor chips, the back surfaces thereof each have a small adhesive area, and thus the cracks Q1 and Q2 may not be sufficiently produced by expansion stress. In this case, bending stress may be applied to curve the substrate, and then expansion may be performed.

Figure 6A:
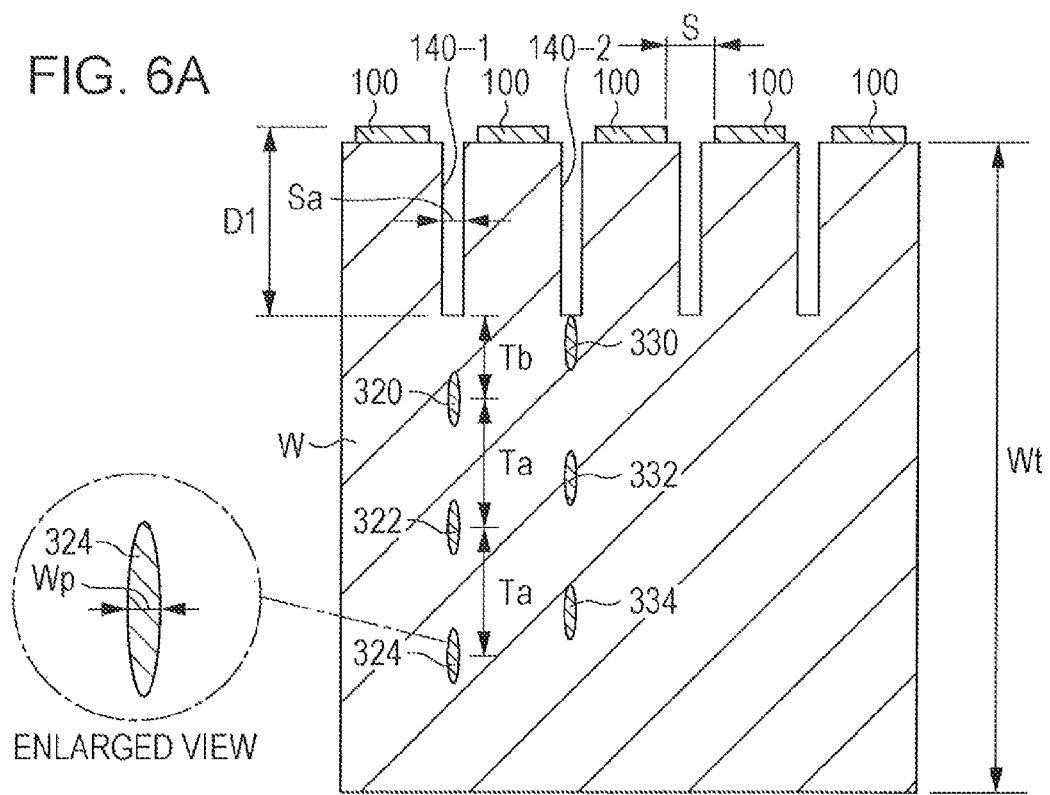
FIG. 6A is a drawing illustrating modified regions according to an exemplary embodiment.

Next, the modified regions according the exemplary embodiment are described with reference to FIG. 6A. As shown in FIG. 6A, the light-emitting elements 100 as device regions are separated from each other with a space S on the front surface of the substrate, and the fine grooves 140-1 and 140-2 (generically named "fine grooves 140") are formed with a width Sa smaller than the space S. In addition, plural modified regions 320, 322, and 324 are formed below the fine groove 140-1 to be aligned with the fine groove 140-1. In a first configuration, the modified regions are formed to have the maximum width Wp smaller than the width Sa of the fine grooves 140 in a direction parallel to the substrate. For example, when the width Sa of the fine grooves 140 is about 5 μm, the width Wp of the modified regions is adjusted to, for example, 1 to 2 μm. FIG. 6A shows a schematic enlarged view of the width Wp of the modified region 324. If the width Sa of the fine grooves 140 is smaller than the width Wp of the modified region, a crack from the uppermost modified region to the fine groove 140 may be deviated from the fine grove 140. In contrast, when the width Sa of the fine grooves 140 is larger than the width Wp of the modified region, deviation of a crack starting from the uppermost modified region from the fine grove 140 is suppressed.

In a second configuration, plural modified regions 320, 322, and 324 are formed at a predetermined distance Ta in the depth direction of the fine groove 140-1, and the depth D1 of the fine grooves 140 is larger than the distance Ta between the modified regions. When the depth D1 of the fine grooves 140 is larger than the distance Ta, a cutting distance Wt−D1 is decreased, and thus the number of the modified regions formed in the depth direction of the substrate is decreased, thereby decreasing the number of times of laser irradiation.

In a third configuration, plural modified regions 320, 322, and 324 are formed at a predetermined distance Ta in the depth direction of the fine groove 140-1, and the distance Tb between the bottom of the fine groove 140-1 and the modified region 320 nearest to the bottom is smaller than the distance Ta between the modified regions. When the distance Tb between the bottom of the fine groove 140-1 and the modified region 320 nearest to the bottom is decreased, deviation of the extension direction of a crack of the modified region 320 from the fine groove 140-1 is more effectively suppressed.

In a fourth configuration, the modified regions are formed near the bottoms of the fine grooves 140. For example, modified regions 330, 332, and 334 are formed in the depth direction of the fine groove 140-2, and among these modified regions, the modified region 330 nearest to the bottom of the fine groove 140-2 is formed at the bottom of the fine groove 140-2 or in the vicinity thereof. Therefore, a crack of the modified region 330 substantially completely coincides with the bottom of the fine groove 140-2. Thus, the crack of the modified region 330 is most likely to extend toward the fine groove 140-2. In the fourth configuration, the distance Tb between the bottom of the fine groove 140 and the modified region 320 in the third configuration can be considered to be decreased to substantially zero. As described below, the position of the modified region 330 is separated by the depth D1 from the front surface of the substrate, and thus the light-emitting elements 100 are not substantially damaged by the thermal influence of laser irradiation. In addition, the light-emitting elements 100 on the front surface of the substrate are avoided from being adversely affected by the dust generated by cracking.

Figure 6B:
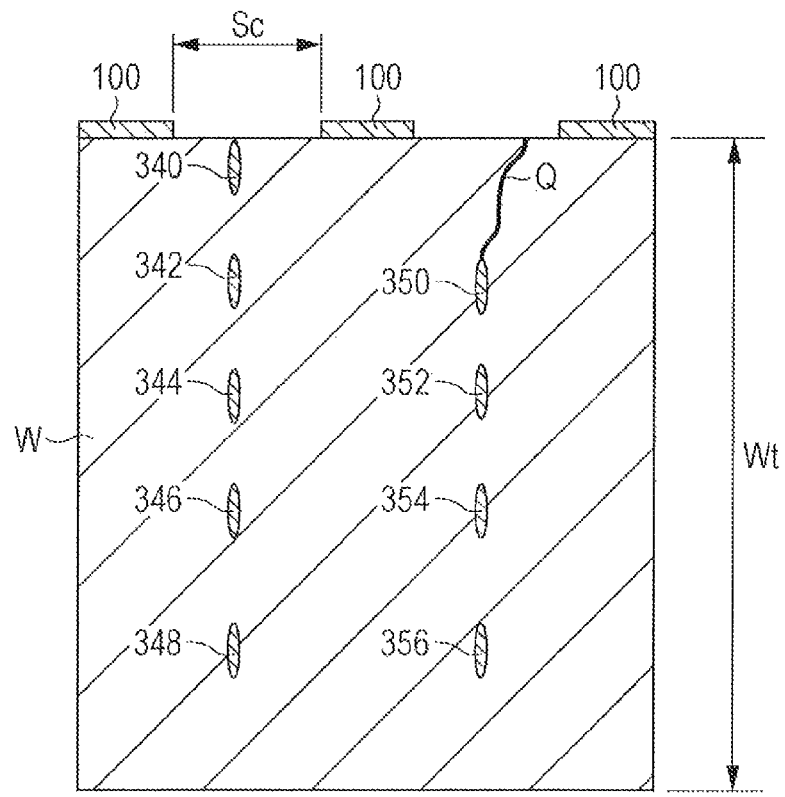
FIG. 6B is a drawing illustrating dicing of a substrate in which fine grooves as in an exemplary embodiment are not formed in a front surface.

FIG. 6B is an explanatory view of laser irradiation dicing of a semiconductor substrate in which fine grooves are not formed in the front surface thereof. In this dicing, the direction of a crack starting from a modified region is not necessarily specified. In order to decrease the influence of this, it is considered that a modified region 340 is formed near the front surface of the substrate. However, the light-emitting elements 100 are formed on the front surface of the substrate, and heat is generated near the substrate by laser irradiation for forming the modified region 340, thereby causing damage to the light-emitting elements because of a near distance to a heat source. Further, when cracks are generated through the modified regions, dust is generated. When the modified regions are present in the front surface of the substrate, the dust may adhere to the light-emitting elements 100 on the surface of the substrate. In order to protect the light-emitting elements from laser irradiation heat and dust, the space Sc of the light-emitting elements 100 is set to be very large so that the light-emitting elements 100 are separated at a large distance from the modified regions. This represents an increase in the width of the cutting regions and thus represents a decrease in the number of semiconductor chips which can be obtained from one substrate. Further, in the substrate having a large thickness Wt, the laser transmission distance to the front surface of the substrate is increased, and thus the desired modified regions may not be formed due to laser attenuation.

In addition, in order to avoid the influence of heat and dust on the front surface of the substrate, as shown in FIG. 6B, a modified region 350 may be formed in the substrate to be separated from the front surface of the substrate. In this case, the direction of extension of a crack Q from the modified region 350 is not necessarily limited to the directly upward direction, and the crack may extent in an oblique direction. In order to avoid the crack Q from extending to the light-emitting element 100, the space Sc of the light-emitting elements 100 is set to be large.

On the other hand, as in the exemplary embodiment, the modified regions can be formed at positions separated from the front surface of the substrate by using a method for forming semiconductor chips by dicing through the fine grooves formed in the front surface of the substrate, thereby protecting the light-emitting elements from heat generated by forming the modified regions and dust generated by cutting. Further, cracks starting from the modified regions are extended to the bottoms of the fine grooves inside the substrate, and thus on the front surface of the substrate, a margin of uncertain cracks due to the modified regions need not be considered. Therefore, in the exemplary embodiment, the space S between the light-emitting elements may be set to be small (S<Sc), and thus the number of semiconductor chips obtained is increased.

Next, fine grooves which can be applied to the exemplary embodiment are described with reference to FIGS. 7A to 7C.

FIG. 7A shows a state where rectangular fine grooves are formed in the front surface of the substrate, and four modified regions 360 are formed in the depth direction. The rectangular fine grooves 140 have side surfaces vertically extending from the front surface to the bottoms so that the width Sa on the surface side is uniform. Fine grooves 140A shown in FIG. 7B have a reverse-tapered shape in which the width Sa on the surface side gradually increases to the width Sb at the bottom (Sb>Sa), and modified regions 370 are formed below the bottom in the depth direction. When the fine grooves 140A have a reverse-tapered shape, the width Sb at the bottom is increased, and thus even when a crack Q from the uppermost modified region 370A is curved, the crack easily reach the fine groove 140A. In other words, the distance between the fine groove 104A and the adjacent modified region 370A can be increased. The degree of increase is determined according to a difference between the width Sb and the width Sa. As a result, the number of modified regions 370 formed in the depth direction of the substrate can be decreased from, for example, 4 in FIG. 7A to 3, and thus the number of times of laser irradiation is decreased, thereby shortening the treatment time.

Unlike the compete reverse-tapered shape shown in FIG. 7B, the fine grooves shown in FIG. 7C each include a portion having a width Sb wider than the width Sa on the front surface side at an intermediate position in the direction toward the bottom. The fine groove 140B has a linear first groove portion having the uniform width Sa and a spherical second groove portion communicating with the bottom of the first groove portion and having a width larger than the width Sa. The fine groove 140C has a linear first groove portion having the width Sa and a semicircular second groove portion connected below the first groove portion and having a width larger than the width Sa. The fine grooves 140B and 140C each have a portion having a width Sb larger than the width Sa, and the thus cracks Q from the uppermost modified regions 380A and 390A easily reach the fine grooves 140B and 140C, respectively. Therefore, like in FIG. 7B, the number of modified regions formed in the depth direction of the substrate can be decreased. The shapes of the fine grooves shown in FIGS. 7A to 7C are examples, and the same effect may be obtained as long as the fine grooves each have a front-side first groove portion having the width Sa and a second groove portion connected below the first groove portion and having the width Sb.

Next, FIGS. 8A to 8D show details of the fine grooves which can be applied to the exemplary embodiment. A fine groove 500 shown in FIG. 8A has a first groove portion 510 having straight side surfaces formed with a depth Da and a substantially uniform width Sa, and a second groove portion 520 connected below the first groove portion 510 and having a depth Db and spherical side surface and bottom. The width Sb of the second groove portion 520 corresponds to the inner diameter of the side surface in a direction parallel to the surface of the substrate, and satisfies the relation Sb>Sa. In the example shown in FIG. 8A, the width Sa2 is maximum near the center of the second groove portion 520.

Figure 8A:
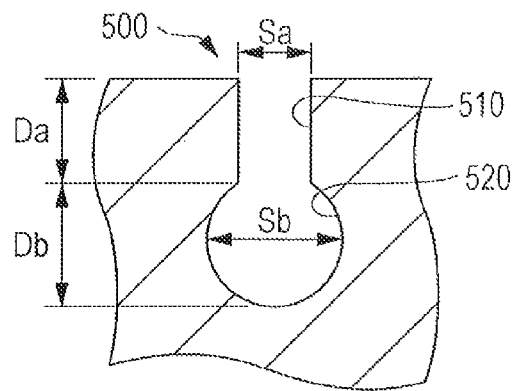
FIGS. 8A to 8D cross-sectional views showing detailed configurations of fine grooves according to an exemplary embodiment of the present invention.

A fine groove 500A shown in FIG. 8B has a first groove portion 510 having straight side surfaces formed with a depth Da and a substantially uniform width Sa, and a rectangular second groove portion 530 connected below the first groove portion 510 and having a depth Db and substantially straight side surfaces. In the second groove portion 530, the spherical side surface and bottom of the second groove portion 520 shown in FIG. 8A are changed to straight surfaces, and the width Sb of the second groove portion 530 corresponds to the distance between side walls facing in a direction parallel to the surface of the substrate, the distance being substantially constant (Sb>Sa). The shapes of the second groove portion shown in the drawings are examples, and the shape of the second groove portion may be any shape as long as it has a wider width than the width Sa of the first groove portion. For example, the second groove portion may have an intermediate shape between the second groove portion 520 shown in FIG. 8A and the second groove portion 530 shown in FIG. 8B, that is, an elliptical shape. In other words, the second groove portion may have a shape having a space with a width wider than the width of the groove (width of the groove at the depth Da) at the interface with the first groove portion.

A fine groove 500B shown in FIG. 8C has a first groove portion 510 having side surfaces formed with a depth Da and a substantially uniform width Sa, and a reverse-tapered second groove portion 540 connected below the first groove portion 510 and having a depth Db. The side surfaces of the second groove portion 540 are inclined so that the width gradually increases toward the bottom. The width Sb of the second groove portion 540 corresponds to the distance between the wide walls facing in a direction parallel to the surface of the substrate, the distance being maximum near the bottom (near the lower end) of the second groove portion 540. In addition, in FIG. 8C, the side surfaces of the first groove portion 510 may be inclined so that the width gradually increases to the bottom as long as the inclination angle is different from the side surfaces of the second groove portion 540.

Figure 8B:
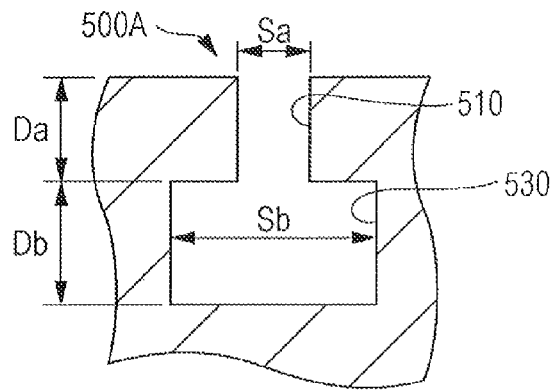
Figure 8C:
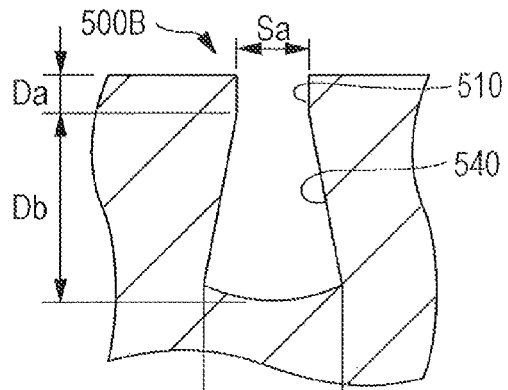
Figure 8D:
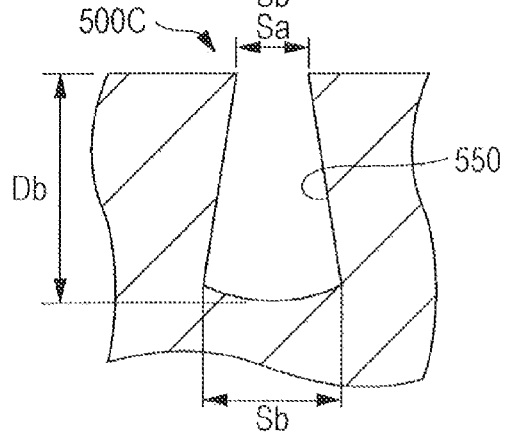

A fine groove 500C shown in FIG. 8D has a shape in which the width gradually increases from the aperture width Sa in the surface of the substrate to the width Sb near the bottom. That is, the fine groove 500C is a reverse-tapered groove having a depth Db. In the fine groove 500C, the depth Da of the first groove portion 510 shown in FIG. 8C is extremely decreased. The shape shown in FIG. 8D is a shape in which comparing the upper and lower portions of the entire groove, the lower portion has a wider width, not a shape in which the angle of the side surface changes at the interface between the first groove portion and the second groove portion as shown in FIGS. 8A to 8C. The shape shown in FIG. 8D has a first groove portion (upper portion) and a second groove portion (lower portion) having a width wider than the first groove portion.

In the shape having the first groove portion 510 having straight side surfaces formed with a depth Da and a substantially uniform width Sa as shown in FIGS. 8A to 8C, chipping and cracking at the corner portions of the semiconductor chips are more suppressed than in the completely reverse-mesa shape as shown in FIG. 8D.

Figure 9:
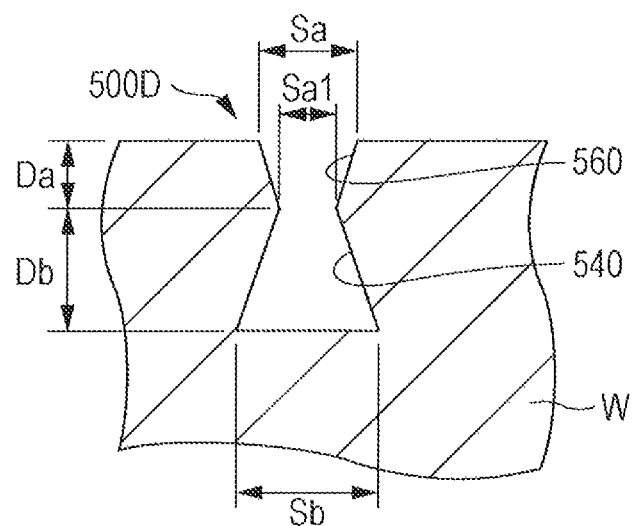
FIG. 9 is a cross-sectional view showing a detailed configuration of another fine groove according to an exemplary embodiment of the present invention.

FIG. 9 shows a fine groove having another shape. A fine groove 500D shown in FIG. 9 has a shape in which the first groove portion 510 having a vertical shape shown in FIG. 8C is changed to a reverse-tapered groove portion 560. The fine groove 500D has opposed side surfaces inclined in the forward direction from the aperture width Sa in the front surface of the substrate to the width Sa1 at a depth Da and opposed side surfaces inclined in a reverse direction from the width Sa1 to the width Sb at the bottom.

The fine grooves 500, 500A, 500B, 500C, and 500D described above may be or may not be formed in line symmetry with respect to a center line perpendicular to the substrate. Each of the fine grooves is shown by straight lines or curved surfaces in order to make the characteristics of the fine groove easy to understand, but it is noted that the side surfaces of an actual fine groove may include a step or irregularity, and the corners are not necessarily formed in an angular shape and may be formed with a curved surface. Also, FIGS. 8A to 8D and FIG. 9 each show merely an example of the shape of the fine groove, and the shape may be another shape as long as it has a first groove portion and a second groove portion communicating with the first groove portion and formed below the first groove portion to have a width wider than the first width. For example, the shape shown in FIG. 9 may have a groove portion having side surface substantially vertical to the substrate between the forward tapered shape with the depth D1 and the reverse tapered shape with the depth D2. In addition, another shape may be a shape formed by combining the shapes shown in FIGS. 8A to 8D and FIG. 9 or a shape formed by combining the shapes shown in FIGS. 8A to 8D and FIG. 9 and further modifying the combined shape. In addition, the angles of the reverse-mesa shape and the forward tapered shape shown in FIGS. 8A to 8D and FIG. 9 are merely examples, and the shape may have inclination from a surface perpendicular to the surface of the substrate with any desired degree of inclination.

Figure 10:
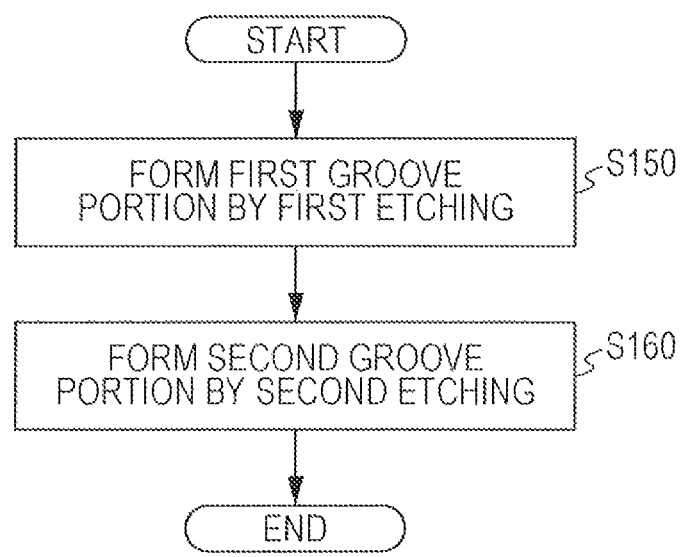
FIG. 10 is a flow chart showing a first method for producing fine grooves according to an exemplary embodiment of the present invention.

Next, a method for producing the fine grooves according to the exemplary embodiment is described. FIG. 10 is a flow chart showing a first method for producing the fine grooves according to the exemplary embodiment. A method for producing the fine grooves shown in FIGS. 8A to 8D and FIG. 9 includes a step (S150) of forming the first groove portion having the width Sa by first etching and a next step (S160) of forming the second groove portion below the first groove portion to have the width Sb wider than the width Sa by second etching. The second etching has higher etching strength than in the first etching in the direction to the side walls. An example using anisotropic dry etching as the first etching and isotropic dry etching as the second etching is described.

Figure 11A:
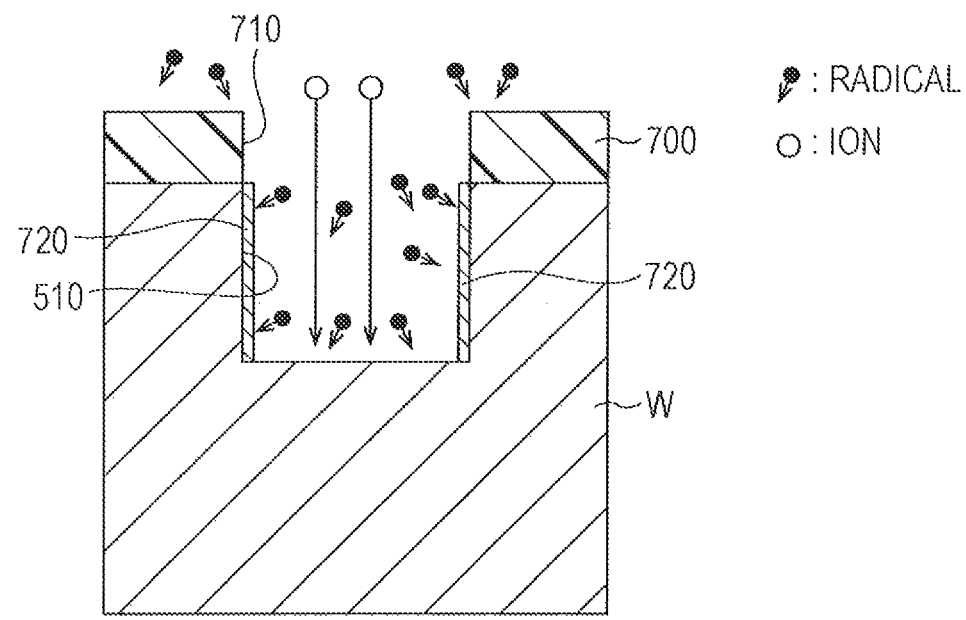
FIGS. 11A and 11B are schematic cross-sectional views showing a first method for producing flask-shaped fine grooves according an exemplary embodiment of the present invention.
Figure 11B:
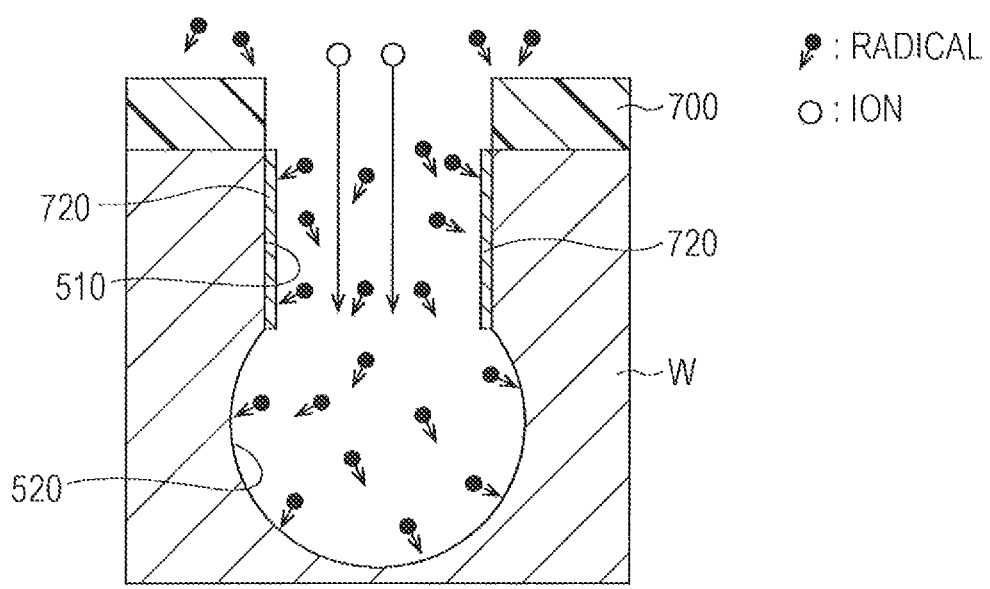

FIGS. 11A and 11B are schematic cross-sectional views illustrating the steps for producing the fine groove 500 shown in FIG. 8A. A photoresist 700 is formed on the front surface of the GaAs substrate W. The photoresist is, for example, i-line resist having a viscosity of 100 cpi and is applied to a thickness of about 8 μm. An aperture 710 is formed in the photoresist 700 by a known photolithographic process using, for example, an i-line stepper and a developer of 2.38% TMAH. The width of the aperture 710 defines the width Sa of the first groove portion.

The first groove portion 510 is formed in the surface of the substrate by anisotropic dry etching using the photoresist 700 as an etching mask. As an example, an inductively coupled plasms (ICP) is used as a reactive ion etching (RIE) apparatus. Examples of etching conditions include an inductively coupled plasma (ICP) power of 500 W, a bias power of 50 W, a pressure of 3 Pa, etching gases $Cl_2$ at 150 sccm, $BCl_3$ at 50 sccm, and $C_4F_8$ at 20 sccm, and an etching time of 20 minutes. As generally known, at the same time as etching, a protective film 720 is formed by adding CF-based gas. In addition, radicals and ions are formed by reaction gas plasma. The side walls of the groove are attacked only by radicals, but are not etched because the protective film 720 is present. On the other hand, the protective film is removed from the bottom by ions vertically entering the groove, and a portion without the protective film is etched with radicals. Therefore, anisotropic etching is achieved.

Next, the etching conditions are changed to perform isotropic etching. As an example, the supply of $C_4F_8$ functioning to form the side wall protective film 720 is stopped. That is, the etching conditions include an inductively coupled plasma (ICP) power of 500 W, a bias power of 50 W, a pressure of 3 Pa, etching gases $Cl_2$ at 150 sccm and BCl$_3$ at 50 sccm, and an etching time of 10 minutes. Since the side wall protective film 720 is not formed by stopping the supply of C$_4$F$_8$, isotropic etching is achieved at the bottom of the first groove portion 510. As a result, the second groove portion 520 is formed below the first groove portion 510. The second groove portion 520 has the spherical side surface and bottom which extend in the lateral and downward direction from the first groove portion 500 with the width Sa. The etching conditions described above are examples and may be appropriately changed according to the width, depth, and shape of the fine groove, and the like.

When the second groove portion of the shape shown in FIG. 8C is formed, the etching strength in the direction to the side wall may be weakened as compared with formation of the second groove portion shown in FIG. 8A. The strength of etching toward the side walls can be changed by changing the etching condition such as the output of an etching apparatus, etching gas, or the like. Specifically, for example, the supply of C$_4$F$_8$ serving as a gas for the side wall protective film is not completely stopped and the flow rate of C$_4$F$_8$ is decreased as compared with the formation of the first groove portion, the flow rate of etching gas Cl$_2$ is increased, or these methods may be combined. In other words, the gas for both the side wall protective film and the etching gas contained in etching gas are supplied during both the formation of the first groove portion and the formation of the second groove portion, but the flow rate of each of the gases may be changed. When the flow rate of each of the gases is previously set before the first groove portion is formed, the first groove portion and the second groove portion can be formed by a series of continuous etching steps. When the first groove portion is formed in a shape (forward-tapered shape) in which the width gradually decreases from the front surface to the back surface of the substrate in order to suppress residue of the adhesive layer, the flow rates of C$_4$F$_8$ and Cl$_2$ or the output of the etching apparatus may be appropriately set or the flow rates may be changes so as to form the forward-tapered shape. The shape shown in FIG. 8D may be formed by omitting the formation of the first groove portion shown in FIG. 8C. Such etching may be generally achieved as anisotropic etching.

FIG. 12 is a flow chart showing a second method for producing fine grooves according to the exemplary embodiment, and FIGS. 13A to 13E are schematic cross-sectional views showing the second method for producing fine groove.

Figure 13A:
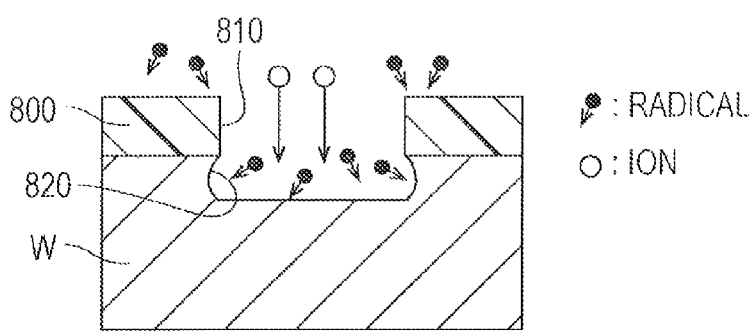
FIGS. 13A to 13E are schematic cross-sectional views showing a second method for forming reverse-tapered fine grooves according an exemplary embodiment of the present invention.

Like in the first production method, as shown in FIG. 13A, a photoresist 800 is formed on the surface of the substrate, and an aperture 810 for etching to form a fine groove is formed in the photoresist 800. Next, a first groove 820 with a predetermined depth is formed in the front surface of the substrate by first isotopic etching using the photoresist 800 as a mask (S200). The first isotropic etching is performed, for example, under the same etching conditions as isotopic etching of the first production method.

Figure 13B:
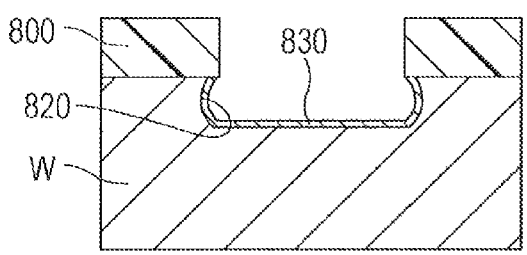

Next, as shown in FIG. 13B, a first protective film 830 is deposited on the side walls and the bottom of the first groove 820 (S210). The first protective film 830 includes, for example, a CF-based polymer, and is deposited by changing only the gases in the first isotropic etching to C$_4$F$_8$.

Next, second isotropic etching is performed (S220). Like in the first isotropic etching, the second isotropic etching is performed with etching gas not containing C$_4$F$_8$. The second isotropic etching is performed under etching conditions which permit the formation of grooves wider than in the first isotropic etching. For example, the second isotropic etching is performed for a longer time than the first isotropic etching.

Figure 13C:
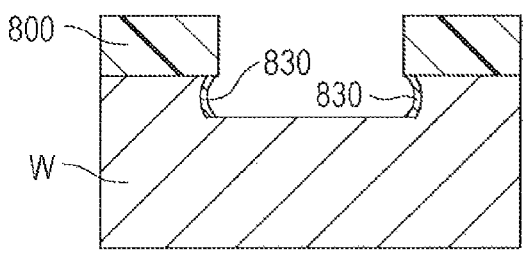
Figure 13D:
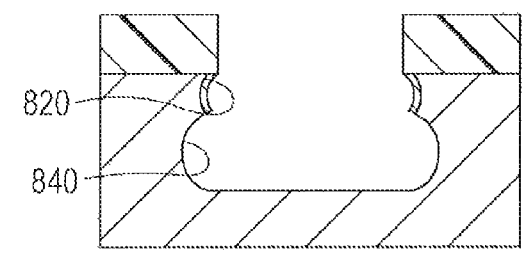

As shown in FIG. 13C, an initial stage of the second isotropic etching, the bottom of the first protective film 830 is etched with ions and removed to expose the bottom of the first groove 820. Then, as shown in FIG. 13D, for example, the second etching is performed for a longer time than the first etching to form a deep second groove 840 extended in the lateral direction below the first groove 820.

Figure 13E:
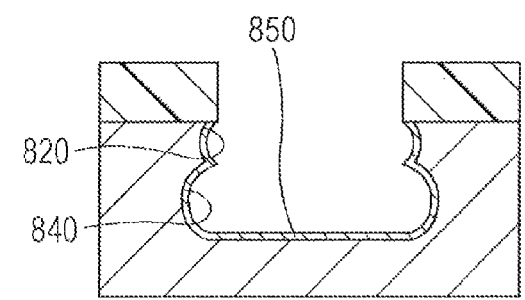

After the second isotropic etching is completed, as shown in FIG. 13E, a second protective film 850 is formed on the side walls and bottom of the first groove 820 and the second groove 840 (S230). The second protective film 850 is formed under the same conditions as in forming the first protective film shown in FIG. 13B. Therefore, a front-side fine groove having a first groove portion and a second groove portion having a width wider than the first groove portion is formed by the first and second isotropic etching and deposition of the first and second protective films. The first and second isotropic etching and deposition of the first and second protective films are further continuously repeated several times to form a reverse-tapered fine groove.

Although the methods for forming the fine grooves according to the exemplary embodiment are described, another method may be used as long as it can form the first groove portion and the second groove portion having a width wider than the first groove portion. For example, the fine grooves may be formed by combination of dry etching and wet etching. In addition, the first groove portion need not be formed only by first etching, and the second groove portion need not be formed only by second etching. That is, the first etching for the first groove portion may include other etching as long as the first etching is main etching, and the second etching for the second groove portion may include other etching as long as the second etching is main etching. In addition, for example, third and fourth groove portions may be present between the first groove portion and the second groove portion or at a position nearer to the back surface side of the substrate than the second groove portion. The third and fourth groove portions may be formed by third etching and fourth etching. In addition, the second groove portion need not necessarily have a width wider than the width of the bottom of the first groove portion. This is because when the first groove portion has a shape in which the width gradually decreases toward the back surface of the substrate, etching conditions are changed so as to decrease the degree of narrowing, and thus the width of a groove at the same depth as in a front-side groove formed by single etching is widened, thereby suppressing deviation of the extension direction of a crack from the width of the front-side groove.

In addition, when front-side fine grooves are formed only by dry etching, isotropic dry etching and anisotropic dry etching may be properly used, for example, as follows. When a first groove portion is formed by anisotropic etching, not isotropic etching, a narrower groove may be easily formed, resulting in an increase in the number of semiconductor chips which can be obtained from one substrate. When a second groove portion is formed by isotropic etching, a wider groove may be easily formed as compared with formation by anisotropic etching, resulting in the suppression of deviation of crack extension from the second groove portion. On the other hand, when a second groove portion is formed by anisotropic etching, a deeper groove may be easily formed as compared with formation by isotropic etching. Therefore, an etching method to be used may be selected so as to form semiconductor chips having a desired shape in consideration of conditions such as the materials of a substrate to be processed, precision of the apparatus used, and the like.

Figure 14:
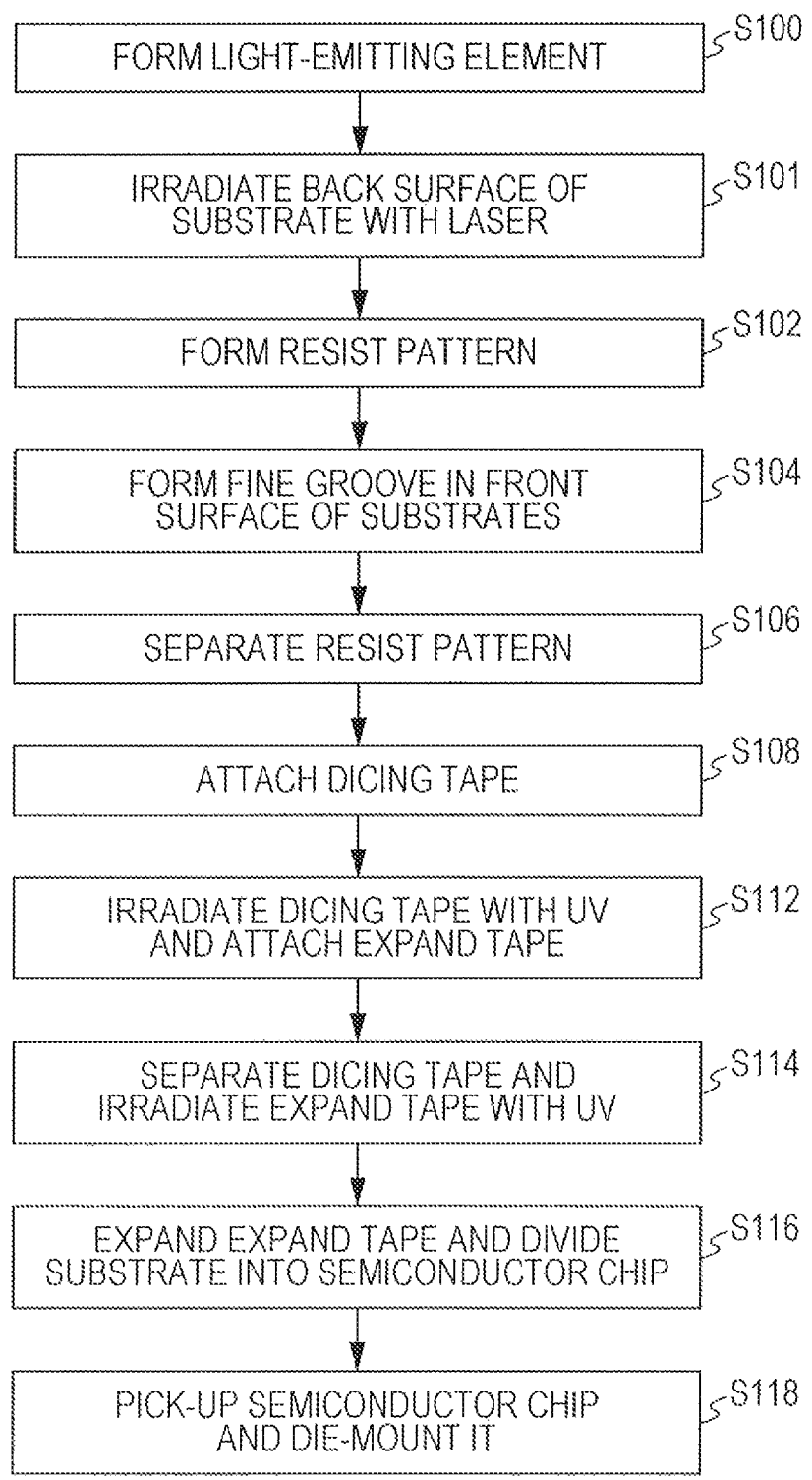
FIG. 14 is a flow chart showing an example of a process for manufacturing a semiconductor chip according to an exemplary embodiment of the present invention.

Next, another example of the manufacturing method according to the exemplary embodiment of the present invention is described. FIG. 1 shows an example of the manufacturing process in which fine grooves are formed in the front surface of a substrate, and then the back surface of the substrate is irradiated with laser for dicing. However, the order of formation of fine grooves and laser irradiation may be reversed. In this case, a manufacturing process is as shown in FIG. 14. As shown in FIG. 14, after light-emitting elements are formed (S100), the back surface of the substrate is irradiated with laser for dicing (S101). Laser irradiation is performed along cutting regions 120, for example, along the centers of the spaces S of the cutting regions 120. After laser irradiation, a resist pattern is formed (S102), and fine grooves are formed in the front surface of the substrate (S104). The other steps are the same as in the manufacturing process shown in FIG. 1.

Figure 15:
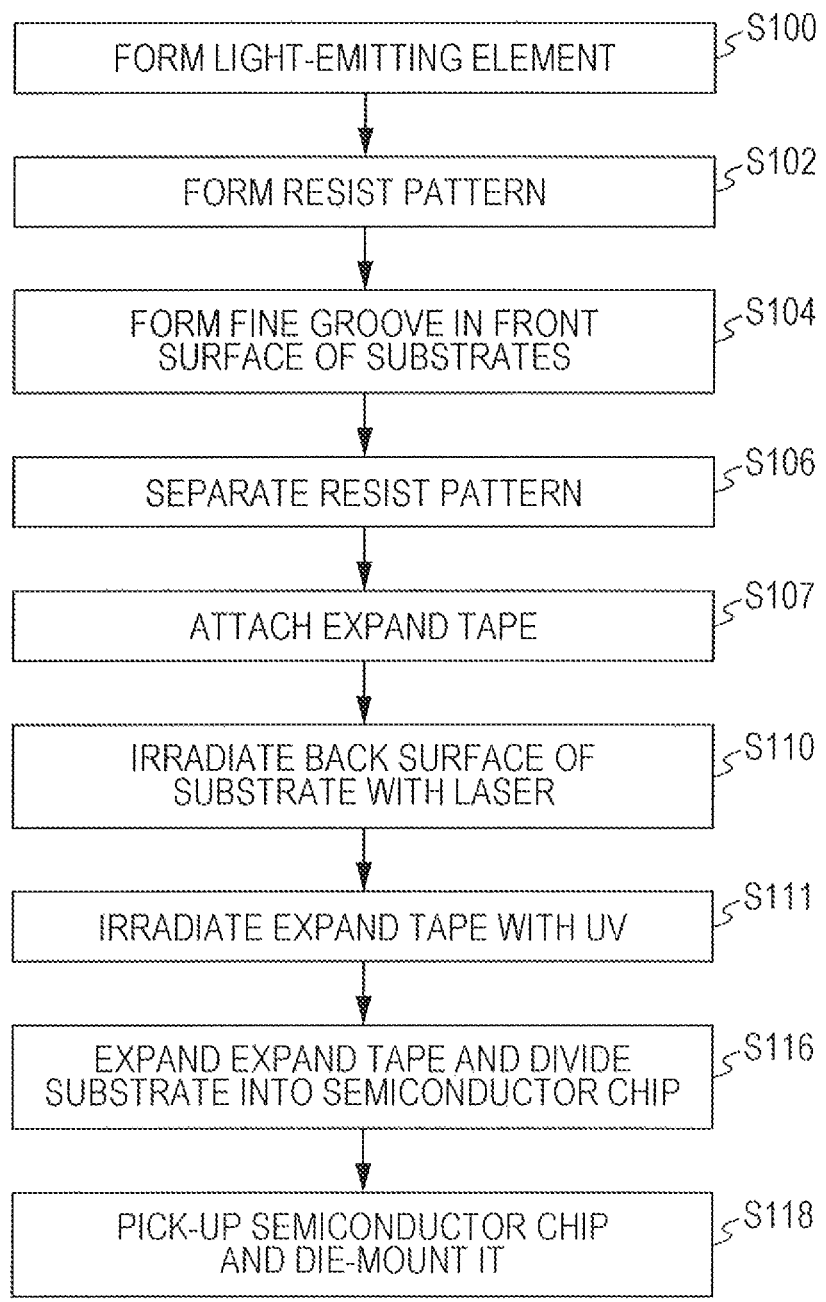
FIG. 15 is a flow chart showing an example of a process for manufacturing a semiconductor chip according to an exemplary embodiment of the present invention.

Further, FIG. 1 shows an example of the manufacturing process in which the back surface of the substrate is irradiated with laser for dicing in a state where the front surface of the substrate is supported by a dicing tape 160. However, the back surface of the substrate may be irradiated with laser for dicing in a state where the back surface of the substrate is supported by an expand tape without a dicing tape covering the front surface of the substrate. In this case, a manufacturing process is as shown in FIG. 15. The steps S100 to S106 are the same as in FIG. 1. After the resist pattern is separated (S106), an expand tape is attached to the back surface of the substrate (S107) without a dicing tape attached to the front surface of the substrate. This step corresponds to S112 shown in FIG. 1. Next, the back surface of the substrate is irradiated with laser through the expand tape (S110). The expand tape includes an adhesive layer of an ultraviolet curable resin which is cured by ultraviolet irradiation and also has the property of transmitting the wavelength of laser. Therefore, the laser beam is transmitted through the expand tape without curing the adhesive layer, forming modified regions in the substrate. After the completion of laser irradiation, next, the expand tape is irradiated with ultraviolet light (S111). Then, like in FIG. 1, the expand tape is expanded, and the substrate is divided into semiconductor chips (S116). This method includes a smaller number of steps than in the manufacturing process shown in FIG. 1, thereby decreasing the number of manufacturing steps and the time.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method for manufacturing a semiconductor chip, wherein the method comprises:
   forming at least a portion of a front-side groove by anisotropic dry etching from a front surface of a substrate along a cutting region;
   forming a modified region in the substrate along the cutting region by irradiating the inside of the substrate, from a back surface of the substrate, with a laser along the cutting region; and
   dividing the substrate along the cutting region by applying stress to the substrate,
   wherein the front-side groove includes a first groove portion extending downward from the front surface of the substrate and a second groove portion disposed below the first groove portion, communicating with the first groove portion, and having a width wider than the width of the first groove portion.

2. The method for manufacturing a semiconductor chip according to claim 1, wherein the width of the front-side groove is wider than the width of the modified region.

3. The method for manufacturing a semiconductor chip according to claim 1, wherein the modified region includes plural modified marks formed at a predetermined distance in the thickness direction of the substrate, and a depth of the front-side groove is larger than the distance.

4. The method for manufacturing a semiconductor chip according to claim 1, wherein the modified region includes plural modified marks formed at a predetermined distance in the thickness direction of the substrate, and the distance between the bottom of the front-side groove and the modified mark nearest to the bottom is smaller than the predetermined distance.

5. The method for manufacturing a semiconductor chip according to claim 1, wherein the modified region includes plural modified marks formed at a predetermined distance in the thickness direction of the substrate, and the modified mark nearest to the front surface of the substrate matches with the bottom of the front-side groove.

6. The method for manufacturing a semiconductor chip according to claim 1, wherein the front-side groove including a first groove portion extending downward from the front surface of the substrate and a second groove portion disposed below the first groove portion, communicating with the first groove portion, and having a width wider than the width of the first groove portion is formed by changing a first etching condition for forming the first groove portion to a second etching condition for forming the second groove portion during the formation of the front-side groove.

7. The method for manufacturing a semiconductor chip according to claim 6,
   wherein the first etching condition is first strength as etching strength in a direction to a side wall of the front-side groove; and
   the second etching is second strength as the etching strength higher than the first strength.

8. The method for manufacturing a semiconductor chip according to claim 6,
   wherein the first etching condition is a first flow rate as a flow rate of gas for forming a protective film that protects the side wall of the groove; and
   the second etching condition is a second flow rate as the flow rate of the gas for forming the protective film lower than the first flow rate.

9. The method for manufacturing a semiconductor chip according to claim 6,
   wherein the first etching condition is a first flow rate as a flow rate of gas for etching; and
   the second etching condition is a second flow rate as the flow rate of the gas for etching higher than the first flow rate.

10. The method for manufacturing a semiconductor chip according to claim 6, wherein the front-side groove includes a first groove portion extending downward from the front surface of the substrate and a second groove portion disposed below the first groove portion, communicating with the first groove portion, and having a width wider than the width of the first groove portion; and the first groove portion is formed by anisotropic dry etching, and the second grove portion is formed by isotropic dry etching.

11. A method for manufacturing a semiconductor chip, the method comprising:

forming a first groove portion from a front surface of a substrate by first anisotropic dry etching along a cutting region;

forming a second groove portion communicating with the first groove portion below the first groove portion by second anisotropic dry etching or isotropic dry etching to form a groove portion wider than that formed by the first anisotropic dry etching;

forming a modified region in the substrate along the cutting region by irradiating the inside of the substrate with a laser along the cutting region; and dividing the substrate along the cutting region by applying stress to the substrate.

12. A method for manufacturing a semiconductor chip, wherein the method comprises:

forming at least a portion of a front-side groove by anisotropic dry etching from a front surface of a substrate along a cutting region;

forming a modified region in the substrate along the cutting region by irradiating the inside of the substrate with a laser along the cutting region; and dividing the substrate along the cutting region by applying stress to the substrate, wherein the modified region includes plural modified marks formed at a predetermined distance in the thickness direction of the substrate, and wherein the front-side groove includes a first groove portion extending downward from the front surface of the substrate and a second groove portion disposed below the first groove portion, communicating with the first groove portion, and having a width wider than the width of the first groove portion.

* * * * *